(12) United States Patent
Yamamoto

(10) Patent No.: US 6,927,617 B2
(45) Date of Patent: Aug. 9, 2005

(54) INTEGRATED CIRCUIT

(75) Inventor: Masahiro Yamamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/418,074

(22) Filed: Apr. 18, 2003

(65) Prior Publication Data

US 2003/0210088 A1 Nov. 13, 2003

Related U.S. Application Data

(62) Division of application No. 10/084,454, filed on Feb. 28, 2002, now Pat. No. 6,605,975.

(30) Foreign Application Priority Data

Oct. 5, 2001 (JP) .......................................... 2001-310126

(51) Int. Cl.[7] ................................................. H03L 5/00
(52) U.S. Cl. ........................ 327/333; 327/434; 361/91.1
(58) Field of Search ................................. 327/108, 112, 327/333, 379, 389, 391, 427, 434, 581, 309, 431; 326/68, 80, 81; 361/18, 58, 91.1, 91.2, 56, 90

(56) References Cited

U.S. PATENT DOCUMENTS

| | | | | |
|---|---|---|---|---|
| 4,809,122 | A | * | 2/1989 | Fitzner .......................... 361/18 |
| 5,057,721 | A | | 10/1991 | Miyazaki et al. ............ 327/404 |
| 5,828,261 | A | * | 10/1998 | Antone et al. ............... 327/427 |
| 5,896,043 | A | * | 4/1999 | Kumagai ....................... 326/68 |
| 5,905,621 | A | | 5/1999 | Drapkin ....................... 361/111 |
| 5,914,545 | A | * | 6/1999 | Pollersbeck ................. 307/131 |
| 5,930,096 | A | * | 7/1999 | Kim ............................. 361/56 |
| 5,963,057 | A | * | 10/1999 | Schmitt et al. ................ 326/81 |
| 5,965,892 | A | | 10/1999 | Tanaka .................... 250/370.08 |
| 6,028,573 | A | * | 2/2000 | Orita et al. .................... 345/66 |
| 6,605,975 | B2 | * | 8/2003 | Yamamoto .................. 327/333 |
| 6,625,516 | B2 | * | 9/2003 | Niimi et al. ................. 327/108 |

* cited by examiner

Primary Examiner—Long Nguyen
(74) Attorney, Agent, or Firm—Oblon, Spivak, McClelland, Maier & Neustadt, P.C.

(57) ABSTRACT

In a level shift circuit for converting a level signal of several volts into a signal of a high level and transmitting the high-level signal, as a voltage reduction unit for reducing an overvoltage applied across the gate and the source of a high-withstand-voltage element used in a signal level conversion unit, a zener diode is connected between the gate and the source such that the anode of the zener diode is on the source side, so that an overcurrent is prevented from flowing in the high-withstand-voltage element.

1 Claim, 3 Drawing Sheets

INTEGRATED CIRCUIT

This application is a Division of application Ser. No. 10/084,454 Filed on Feb. 28, 2002, now U.S. Pat. No. 6,605,975.

BACKGROUND OF THE INVENTION

1. Field of the Invention

The present invention relates to a level shift circuit in a power element drive integrated circuit.

2. Description of the Prior Art

As power element drive integrated circuits for home electric appliances and industries, in place of conventional photocouplers, high-voltage integrated circuits (HVIC) have been popularly used. Depending on applications, a voltage of several 100 V which is close to a power supply voltage of a power element is applied to the HVIC itself. For this reason, a high-withstand-voltage circuit is indispensable. Therefore, the circuit is manufactured by high-voltage processes for semiconductors.

In many cases, this HVIC is directly driven by a signal from a microcomputer. For this reason, in order to transmit a low-potential signal (about 5 V) of a microcomputer, a level shift circuit for converting the signal into a signal having a high potential (several 10 V) is constituted. As the level shift circuit, a high-withstand-voltage signal transmission element is used, and has a withstand voltage higher than the power supply voltage of the power element.

As this high-withstand-voltage element, a MOS transistor is mainly used. However, in an operation state in which a voltage of several 100 V is applied, when an overcurrent flows in the high-withstand-voltage MOS transistor, the element may be overheated to be broken.

This point will be described below by using a conventional HVIC level shift circuit shown in FIG. 6. This circuit is constituted by an HVIC power supply VCC (1), a power element power supply HV (2), an offset power supply VS (3) using an output voltage as a power supply, a floating power supply VB (4) having a negative electrode connected to the offset power supply VS (3), a high-withstand-voltage MOS transistor (5), a drive inverter (7) for the high-withstand-voltage MOS transistor (5), a resistor (9) for pulling up the drain of the high-withstand-voltage MOS transistor (5) to the voltage of the floating power supply VB (4), and a diode (10) inserted between the drain of the high-withstand-voltage MOS transistor (5) and the VS (3).

When a P-ch MOS transistor of the drive inverter (7) is turned on by an input signal to pull up the gate voltage of the high-withstand-voltage MOS transistor (5), the high-withstand-voltage MOS transistor (5) is turned on. A drain current at this time is supplied from the floating power supply VB (4) through the resistor (9). When this drain current is sufficient, a drain potential Vds of the high-withstand-voltage MOS transistor (5) exceeds the threshold value of the inverter (power element) connected to the output of the high-withstand-voltage MOS transistor (5), and a drive signal is sent to the gate of the power element.

When the offset power supply VS (3) is boosted to several 100 V, the diode (10) inserted between the offset power supply VS (3) and the drain of the high-withstand-voltage MOS transistor (5), and the drain potential Vds is clamped to VS-VF (forward voltage of the diode (10)). When the current sink capability of the high-withstand-voltage MOS transistor (5) is sufficient, a drain current is supplied from the offset power supply VS (3) through the diode (10).

The current sink capability of the high-withstand-voltage MOS transistor (5) increases depending on a voltage Vgs applied across the gate and the source. For this reason, in a state in which a voltage of several 100 V is applied across the drain and the source, when a voltage (15 to 20 V) which is close to the power supply Vcc is applied across the gate and the source, an overcurrent flows in the high-withstand-voltage MOS transistor (5), and element breakdown may occur.

Since the capacitance (gate capacitance) between the gate and the source of the high-withstand-voltage MOS transistor (5) is considerably large, when a very short input signal having a time which is taken to cause the voltage of the high-withstand-voltage MOS transistor (5) to reach the gate voltage at which the high-withstand-voltage MOS transistor (5) operates is input, the high-withstand-voltage MOS transistor (5) is not turned on. As a result, a response speed is low.

SUMMARY OF THE INVENTION

The present invention provides a level shift circuit which can prevent element breakdown of a high-withstand MOS transistor and which increases a response speed of the high-withstand-voltage MOS transistor.

According to the present invention, a level shift circuit for converting a level signal of several volts into a signal of a high level and transmitting the high-level signal is characterized by comprising voltage reduction means for reducing an overvoltage applied across the gate and the source of a high-withstand-voltage element used in a signal level conversion unit.

DETAILED DESCRIPTION OF THE INVENTION

Embodiment 1

Figure 1:
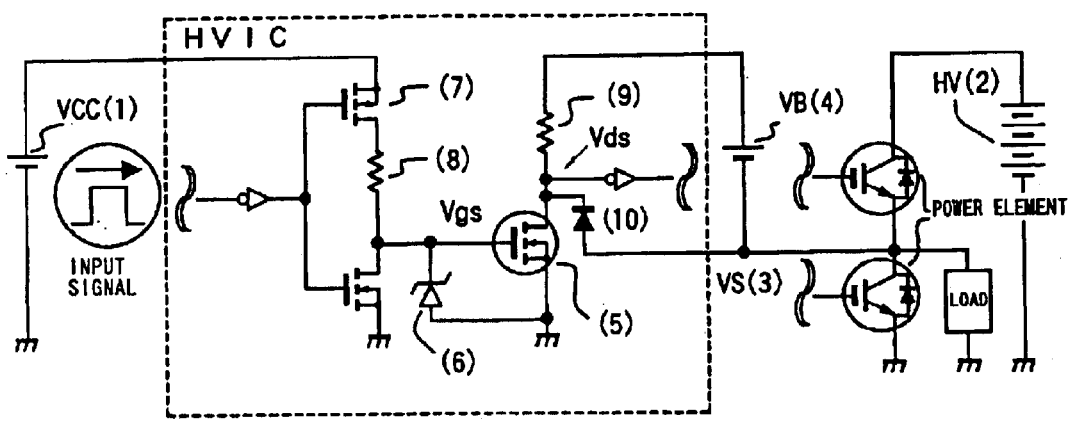
FIG. 1 is a circuit diagram of a high-voltage integrated circuit (HVIC) showing the first embodiment of the present invention.

An HVIC shown in FIG. 1 is constituted by an HVIC power supply VCC (1), a power element power supply HV (2), an offset power supply VS (3) using an output voltage as a power supply, a floating power supply VB (4) having a negative electrode connected to the offset power supply VS (3), a high-withstand-voltage MOS transistor (5), a zener diode (6) connected between the gate and the source of the high-withstand-voltage MOS transistor (5) such that the anode of the zener diode (6) is on the source side, a drive inverter (7) of the high-withstand-voltage MOS transistor (5), a resistor (8) inserted between the connection point between the drain of the N-ch MOS transistor of the drive inverter (7) and the gate of the high-withstand-voltage MOS transistor (5) and the drain of the P-ch MOS transistor of the drive inverter (7), a resistor (9) for pulling up the drain of the high-withstand-voltage MOS transistor (5) to the voltage of the VB (4), and a diode (10) inserted between the drain of the high-withstand-voltage MOS transistor (5) and the VS (3).

In this circuit configuration, the P-ch MOS transistor of the drive inverter (7) is turned on by an input signal. When the gate voltage of the high-withstand-voltage MOS transistor (5) is boosted, the high-withstand-voltage MOS transistor (5) is turned on. A drain current flowing in this case is supplied from the floating power supply VB (4) through the resistor (9). When the drain current is sufficient, a drain potential Vds of the high-withstand-voltage MOS transistor (5) exceeds the threshold value of the inverter (power element) connected to the output of the high-withstand-voltage MOS transistor (5), and a drive signal is sent to the gate of the power element.

When the offset power supply VS (3) is boosted to several 100 V, the diode (10) inserted between the offset power supply VS (3) and the drain of the high-withstand-voltage MOS transistor (5) is turned on, and the drain potential Vds is clamped to VS-VF (forward voltage of the diode (10)). When the current sink capability of the high-withstand-voltage MOS transistor (5) is sufficient, a drain current is supplied from the offset power supply VS (3) through the diode (10).

Figure 6:
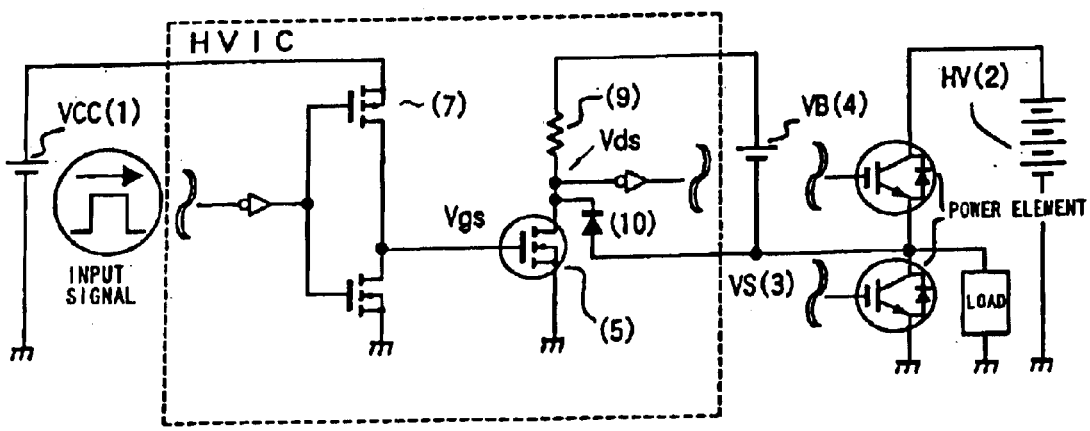
FIG. 6 is a circuit diagram of a conventional high-voltage integrated circuit (HVIC).

When the zener diode (6) is not used, as has been described with respect to FIG. 6, an overcurrent flows in the high-withstand-voltage MOS transistor (5) when a voltage Vgs between the gate and the source is large, and element breakdown may occur. However, according to the circuit configuration shown in FIG. 1, since the voltage Vgs between the gate and the source is not larger than a breakdown voltage (about 6 V) of the zener diode (6), an excessive drain current does not flow in the high-withstand-voltage MOS transistor (5), and a reliable product which does not cause element breakdown can be realized. The resistor (8) is used to limit a current flowing in the zener diode (6).

Embodiment 2

Figure 2:
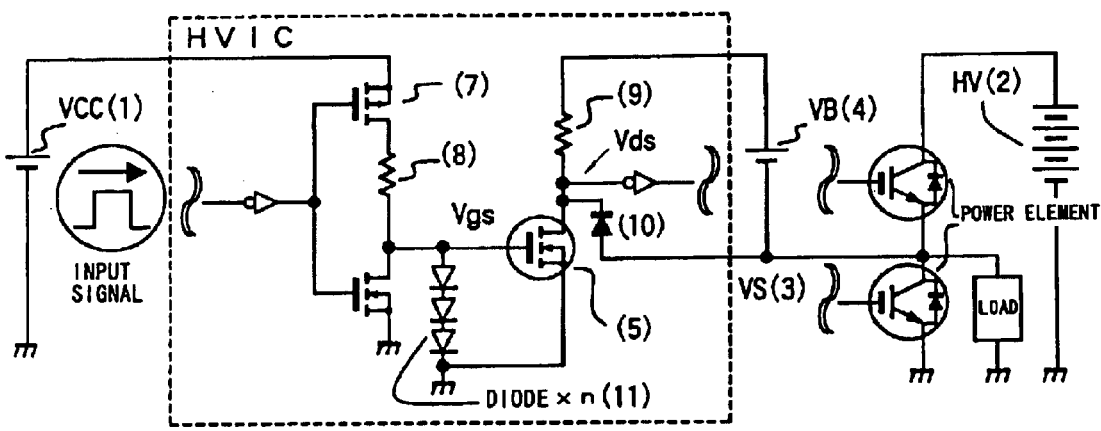
FIG. 2 is a circuit diagram of a high-voltage integrated circuit (HVIC) showing the second embodiment of the present invention.

In an HVIC shown in FIG. 2, in place of the zener diode (6) shown in FIG. 1, n diodes (11) which are connected in series with each other have a cathode side connected to the source of a high-withstand-voltage MOS transistor (5). In this case, a voltage Vgs between the gate and the source is restricted to a forward voltage xnV of the diodes (11) at the most. Since the voltage Vgs can be set to be an arbitrary value by increasing or decreasing the number n of diodes, an excessive drain current does not flow in the high-withstand-voltage MOS transistor (5), and a reliable product which does not cause element breakdown can be realized. The resistor (8) is used to limit a current flowing in the diodes (11).

Embodiment 3

Figure 3:
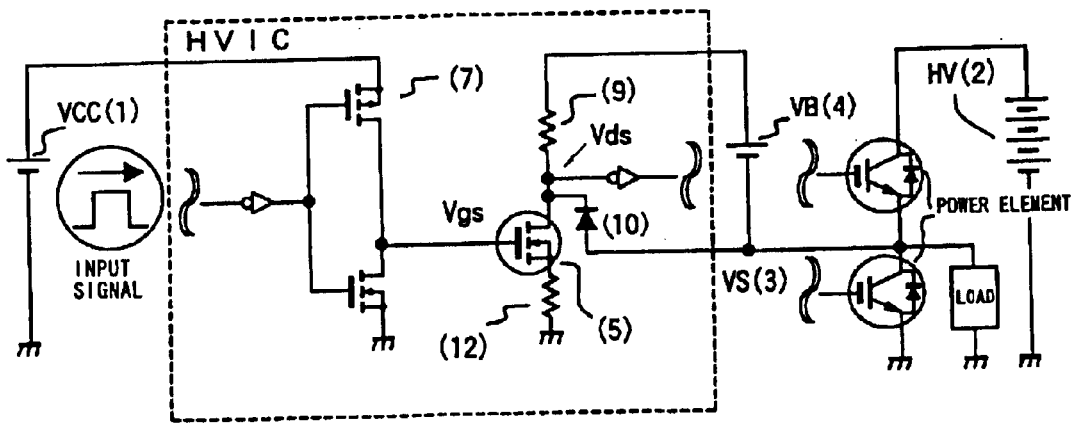
FIG. 3 is a circuit diagram of a high-voltage integrated circuit (HVIC) showing the third embodiment of the present invention.

In an HVIC shown in FIG. 3, in FIG. 6, a resistor (12) is inserted between the source of a high-withstand-voltage MOS transistor (5) and the ground. As described above, the drain current increases depending on a voltage Vgs applied across the gate and the source of the high-withstand-voltage MOS transistor (5). For this reason, when a voltage (15 to 20 V) which is close to a power supply Vcc is applied across the gate and the source in a state in which a voltage of several 100 V is applied across the drain and the source, an overcurrent flows in the high-withstand-voltage MOS transistor (5). However, when the resistor (12) is inserted between the source of the high-withstand-voltage MOS transistor (5) and the ground according to this embodiment, the increase of the drain current increases a voltage between both the ends of the resistor (12) to boost a source potential. The voltage Vgs decreases by the increase of the source potential, and the drain current is suppressed, so that the element breakdown of the high-withstand-voltage MOS transistor (5) can be prevented.

Embodiment 4

Figure 4:
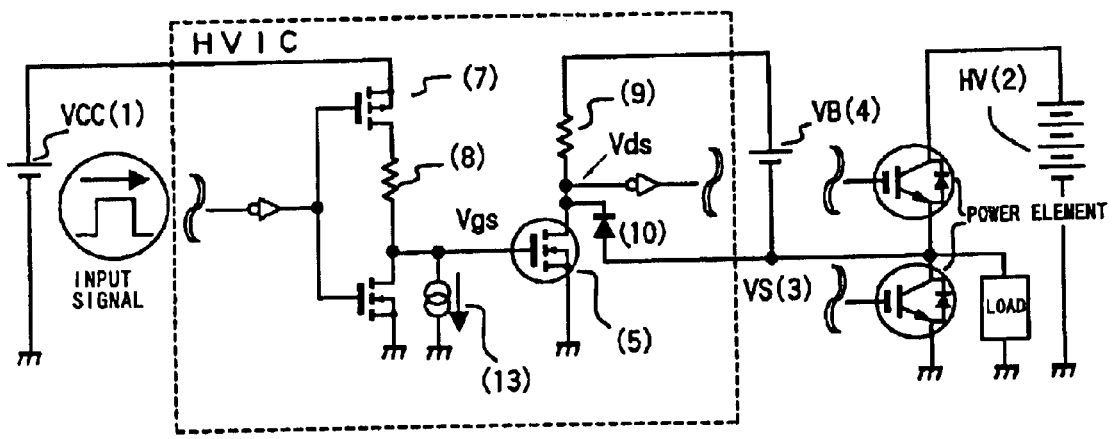
FIG. 4 is a circuit diagram of a high-voltage integrated circuit (HVIC) showing the fourth embodiment of the present invention.

In an HVIC shown in FIG. 4, a temperature compensation constant current source (13) is used in place of the zener diode (6) shown in FIG. 1. A voltage between both the ends of a resistor (8) is generated by the sink current of the constant current source (13). Since a voltage Vgs between the gate and the source decreases, the drain current is suppressed. The element breakdown of a high-withstand-voltage MOS transistor (5) can be prevented.

In addition, the current sink characteristics of the temperature compensation constant current source (13) have a temperature compensation function, so that the temperature characteristics of a resistor (8) and the temperature characteristics of the drain current to the voltage Vgs between the gate and the source of the high-withstand-voltage MOS transistor (5) can be compensated for, and the drain current can be more accurately restricted.

Embodiment 5

Figure 5:
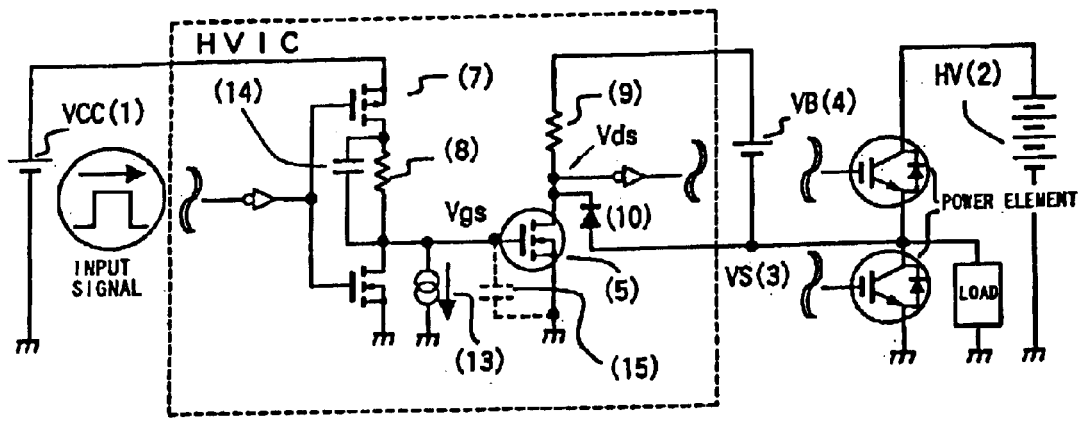
FIG. 5 is a circuit diagram of a high-voltage integrated circuit (HVIC) showing the fifth embodiment of the present invention.

In an HVIC shown in FIG. 5, a capacitor (14) is connected in parallel to a resistor (8) in FIG. 5. Between the gate and the source of a high-withstand-voltage MOS transistor (5), a large capacitance exists as shown as a gate capacitance (15) indicated by a broken line. For this reason, when a very short signal is input, the potential is not boosted to a gate potential at which the high-withstand-voltage MOS transistor (5) can be operated, and the signal cannot be transmitted.

However, in this embodiment, the moment the P-ch MOS transistor of the drive inverter (7) is turned on by an input signal, the voltage Vgs of the high-withstand-voltage MOS transistor (5) is raised to a potential which is close to a power supply VCC (1) because the capacitor (14) is not charged. The high-withstand-voltage MOS transistor (5) is operated by a sufficient gate potential, and can transmit a signal. Thereafter, the capacitor (14) is charged by a sink current of the temperature compensation constant current source (13), the voltage Vgs of the high-withstand-voltage MOS transistor (5) is converged to a predetermined potential (Vgs for restricting a drain current value). According to this embodiment, the response speed of the high-withstand-voltage MOS transistor (5) is increased. An accurate product is realized.

According to the present invention, a level shift circuit for converting a level signal of several volts into a signal of a high level and transmit the high-level signal comprises a voltage reduction means for reducing an overvoltage applied across the gate and the source of a high-withstand-voltage element used in a signal level conversion unit. For this reason, element breakdown caused by applying an overvoltage across the gate and the source, and a level shift circuit having high reliability can be realized.

Since a capacitor is connected in parallel to a resistor connected to the gate of a high-withstand-voltage element, even if a very short input signal having a time which is not shorter than the time which is taken to cause the voltage of the high-withstand-voltage MOS transistor to reach the gate voltage at which the high-withstand-voltage MOS transistor operates is input, the high-withstand-voltage MOS transistor (5) is reliably turned on, and a response speed is increased.

What is claimed is:

1. A circuit comprising:
   a high-withstand-voltage element configured to convert an input signal at a first voltage into a second higher level signal, the high-withstand-voltage element including a source, a gate, and a drain;
   a first power supply;
   a second power supply;
   a first resistor configured to pull up the drain of the high-withstand-voltage element to the voltage of the second power supply;

a diode connected between the drain of the high-withstand-voltage element and the first power supply; and a second resistor connected between the source of the high-withstand voltage element and ground;

wherein an increase of the drain current supplied by the first power source through the diode increases a voltage across the second resistor in order to (a) boost a source potential of the high-withstand-voltage element and (b) decrease the gate to source voltage of the high-withstand-voltage element by the amount of the increase of the boost in the source potential.

* * * * *